(12) United States Patent
Yabe et al.

(10) Patent No.: US 11,885,957 B2
(45) Date of Patent: Jan. 30, 2024

(54) OPTICAL DEFLECTOR

(71) Applicant: PIONEER CORPORATION, Tokyo (JP)

(72) Inventors: Tomotaka Yabe, Tokyo (JP); Kenji Kawai, Tokyo (JP); Seiro Oshima, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 493 days.

(21) Appl. No.: 16/975,675

(22) PCT Filed: Feb. 13, 2019

(86) PCT No.: PCT/JP2019/004981
§ 371 (c)(1),
(2) Date: Aug. 25, 2020

(87) PCT Pub. No.: WO2019/167615
PCT Pub. Date: Sep. 6, 2019

(65) Prior Publication Data
US 2020/0409138 A1 Dec. 31, 2020

(30) Foreign Application Priority Data
Feb. 27, 2018 (JP) .................. 2018-032852

(51) Int. Cl.
*G02B 26/08* (2006.01)
*G02B 26/10* (2006.01)
*H02N 2/02* (2006.01)

(52) U.S. Cl.
CPC ....... *G02B 26/0816* (2013.01); *G02B 26/101* (2013.01); *H02N 2/028* (2013.01)

(58) Field of Classification Search
CPC .............. G02B 26/0816; G02B 26/101; G02B 26/0858; H02N 2/028; B81B 2201/042; B81B 3/0043
See application file for complete search history.

(56) References Cited

U.S. PATENT DOCUMENTS

| 9,395,536 B2 | 7/2016 | Yasuda et al. |
| 2011/0002022 A1 | 1/2011 | Park et al. |
| 2014/0198260 A1* | 7/2014 | Murayama ......... G02B 26/0858 359/224.1 |

FOREIGN PATENT DOCUMENTS

| EP | 2808719 A1 | 12/2014 |
| EP | 2827183 A1 | 1/2015 |

(Continued)

OTHER PUBLICATIONS

European Patent Office, Extended European Search Report, Application No. EP 19761500.8-1020, dated Oct. 4, 2021 in 10 pages.

(Continued)

*Primary Examiner* — Euncha P Cherry
(74) *Attorney, Agent, or Firm* — Procopio, Cory, Hargreaves & Savitch LLP

(57) ABSTRACT

An optical deflector capable of making a swing angle of a reflective plate larger is provided. In drive elements, since a size in the Y direction at first positions separated by a first distance from the reflective plate is larger than a size in the Y direction at second positions separated by a second distance from the reflective plate, the second distance being greater than the first distance, it is possible to increase displacement of tips of beam portions at the first positions and to make a swing angle of the reflective plate large by increasing a generated force of the entire beam portions.

8 Claims, 3 Drawing Sheets

(56) References Cited

FOREIGN PATENT DOCUMENTS

| JP | 2014153703 A | 8/2014 |
|----|--------------|--------|
| JP | 2014232180 A | 12/2014 |
| JP | 2015-22064 A | 2/2015 |

OTHER PUBLICATIONS

Nanotechnology, "Lateral bending of tapered piezo-semiconductive nanostructures for ultra-sensitive mechanical force to voltage conversion", Araneo et al., dated Apr. 13, 2013 in 13 pages.
Wang, et al., Deflection Characteristics of a Trapezoidal Multilayer In-Plane Bending Piezoelectric Actuator, IEEE Transactions on Ultrasonics, Ferroelectrics, and Frequency Control, vol. 48, No. 4, Jul. 2001, in 8 pages.
European Patent Office, Communication Pursuant to Article 94(3) EPC, Application No. 19 761 500.8-1020, dated Sep. 8, 2022, in 5 pages.
Japanese Patent Office, Notice of Reasons for Refusal, Application No. JP 2020-502918, dated Mar. 22, 2022, in 7 pages.
International Search Report and Written Opinion for related JP App. No PCT/JP2019/004981 dated Apr. 23, 2019. English translation provided; 7 pages.

\* cited by examiner

OPTICAL DEFLECTOR

CROSS-REFERENCE TO RELATED APPLICATIONS

This application is a U.S. National Stage entry of PCT Application No. PCT/JP2019/004981, filed on Feb. 13, 2019, which claims priority to JP Application No. 2018-032852 filed Feb. 27, 2018, The contents of the foregoing are incorporated by reference.

TECHNICAL FIELD

This invention relates to an optical deflector.

BACKGROUND ART

There is conventionally proposed an apparatus allowing a mirror portion to rotate by connecting the mirror portion (reflective plate) on a free end side of an arm portion (beam portion) and providing a piezoelectric element (drive element) on the arm portion as an optical deflector to scan with light (for example, refer to Patent Document 1). In the optical deflector described in Patent Document 1, by forming a passive region on the free end side of the arm portion, the passive region having no piezoelectric element provided, the piezoelectric element is inhibited from being damaged when the arm portion is warped and deformed.

CITATION LIST

Patent Literature

[Patent Document 1]: Japanese Unexamined Patent Application Publication No. 2014-153703

SUMMARY OF THE INVENTION

Technical Problem

In an optical deflector having a drive system described in Patent Document 1, a warp of a beam portion (displacement of a tip) is increased when a size of a drive element in a direction orthogonal to a rotation axis becomes larger while a generated force (a force to cause the reflective plate to rotate) generated in the beam portion is decreased. It is necessary to increase the generated force also while increasing the displacement of the tip of the beam portion to make a swing angle of the reflective plate large, however, achieving these at the same time was difficult.

Therefore, an example of the problems to be solved by the present invention is to provide an optical deflector capable of making a swing angle of a reflective plate large.

Solution to Problem

In order to solve the problem and to achieve the object aforementioned, an optical deflector of the present invention defined in claim 1 includes: a reflective plate; a pair of shaft portions determining a rotation axis of the reflective plate; a pair of beam portions supporting the pair of shaft portions while extending to intersect the rotation axis; and drive elements rotating the reflective plate by deforming the beam portions, in which the drive elements are arranged in the beam portions and a size thereof in a direction orthogonal to the rotation axis at positions separated by a first distance from the reflective plate along an axial direction of the rotation axis is larger than a size in the direction orthogonal to the rotation axis at positions separated by a second distance from the reflective plate along the axial direction, the second distance being greater than the first distance.

DESCRIPTION OF EMBODIMENTS

Figure 1:
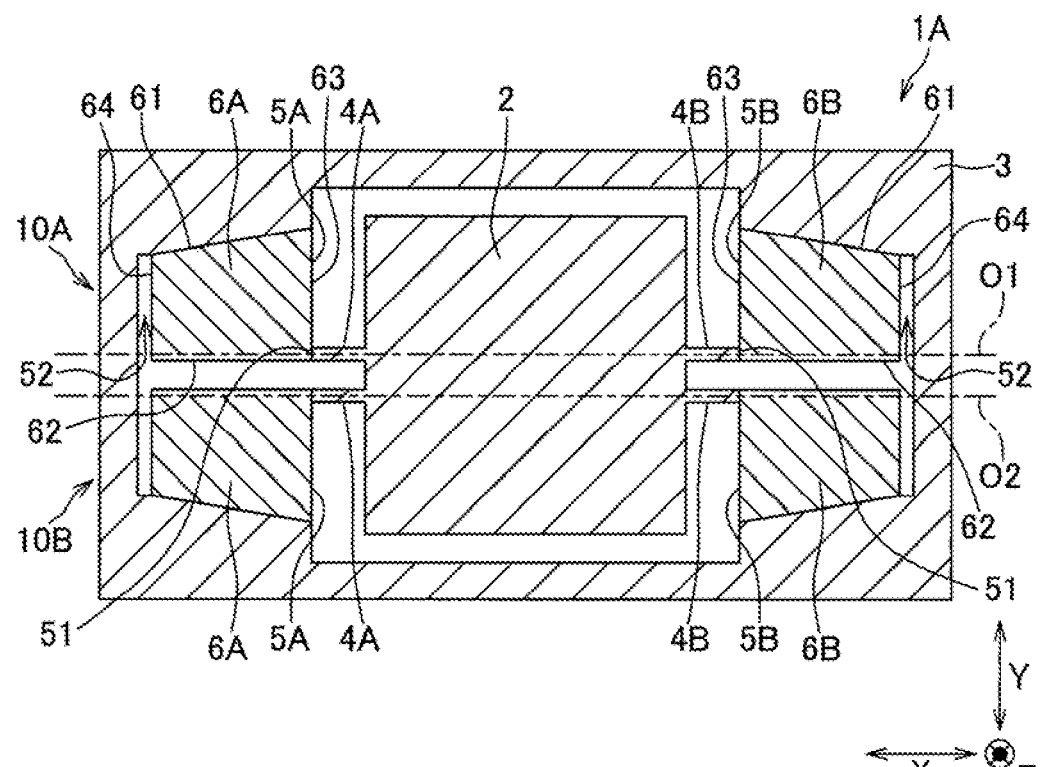
FIG. 1 is a plan view illustrating an optical deflector according to an example of the present invention.

An embodiment of the present invention will be described below. An optical deflector according to the embodiment of the present invention includes a reflective plate, a pair of shaft portions determining a rotation axis of the reflective plate, a pair of beam portions supporting the pair of shaft portions while extending to intersect the rotation axis, and drive elements rotating the reflective plate by deforming the beam portions. The drive elements are arranged in the beam portions and a size thereof in a direction orthogonal to the rotation axis at positions separated by a first distance from the reflective plate along a axial direction of the rotation axis is larger than a size in the direction orthogonal to the rotation axis at positions separated by a second distance from the reflective plate along the axial direction, the second distance being greater than the first distance.

In the drive elements, since the size in the orthogonal direction at the positions (first positions) separated by the first distance from the reflective plate is larger than the size in the orthogonal direction at the positions (second positions) separated by the second distance which is greater than the first distance from the reflective plate, displacement of the tip of a beam portion is increased at the first position than the second position. Further, compared to a configuration in which the size in the orthogonal direction in an entire area of the beam portion is made to be the same as the size in the orthogonal direction at the first position, a generated force of an entire beam portion is increased.

A swing angle of the reflective plate is more easily affected by an amount of the displacement of the beam portion at a position of the tip of the beam portion which is closer to the reflective plate. Further, the generated force of the entire beam portion affects the swing angle of the reflective plate. Therefore, by increasing the displacement of the tip of the beam portion at the first position and increasing the generated force of the entire beam portion, it is possible to make the swing angle of the reflective plate large.

In the drive element, minute areas having a predetermined width at the positions separated by the first distance from the reflective plate is preferably larger than minute areas having a predetermined width at the positions separated by the second distance from the reflective plate. Thus, it is possible to increase the displacement of the tips of the beam portions at the first positions and increase the generated force of the entire beam portions, and as a result, it is possible to make the swing angle of the reflective plate large.

First sides on a side of base ends of the beam portions in the drive elements preferably have inclination portions which are inclined with respect to the axial direction to become closer to the rotation axis as getting more separated from the reflective plate along the axial direction. Thus, the size in the orthogonal direction of the drive element at the first position becomes larger than the size in the orthogonal direction of the drive element at the second position, and it becomes possible to increase the generated force of the entire beam portion while increasing the displacement of the tip of the beam portion at the first position, and thereby, it is possible to make the swing angle of the reflective plate large.

Second sides on a side of the tips of the beam portions in the drive elements are preferably arranged on extension lines of the shaft portions. Thus, it is possible to suitably rotate the reflective plate.

It is preferable that a frame surrounding the reflective plate and the beam portion is further included, and that a slit extending from the tip of the beam portion to a base end is formed between the beam portion and the frame. Thus, it is possible to suitably displace the tip of the beam portion.

A drive unit may be constituted with the pair of shaft portions, the pair of beam portions, and the drive element, and two sets of drive units arranged to be aligned in a direction orthogonal to the rotation axis may also be included. When the reflective plate is rotated in a direction opposite to each other by the two sets of drive units, it is possible to make the total of swing angles of the reflective plate large.

EXAMPLES

An example of the present invention will be described specifically below. As shown in FIG. 1, an optical deflector 1A includes a reflective plate 2, a frame 3, two sets of drive units 10A and 10B. The optical deflector 1A is used to scan with the infrared ray in a detection device which is e.g. mounted in a vehicle and detects a distance between the vehicle and another vehicle or a road installation article by sending and receiving light such as an infrared ray or the like. In the present example, the axial direction of rotation axes O1 and O2 of the reflective plate 2 is an X direction, a direction orthogonal to the X direction in-plain of beam portions 5A and 5B which are plate-likely formed as described later is a Y direction, and a plate thickness direction of the beam portions 5A and 5B is a Z direction.

The reflective plate 2 has a reflecting surface reflecting light on one side, and is formed in a rectangular plate shape. The frame 3 is formed in a rectangular frame shape, and accommodates the reflective plate 2 and the two sets of drive units 10A and 10B in the inside thereof.

The drive unit 10A includes a pair of shaft portions 4A and 41, a pair of beam portions 5A and 5B, and a pair of drive elements 6A and 6B. The drive unit 11B has the same constitution as that of the drive unit 10A, and has a symmetric shape with the drive unit 10A with a ZX plane as a plane of symmetry, and below, the drive unit 10A is mainly described.

The shaft portions 4A and 4B continue to a position deviated from the central portion to one side (an upper side in FIG. 1) of the Y direction out of sides along the Y direction on the reflective plate 2, and extend along the X direction.

The beam portions 5A and 5B are arranged in the vicinity of corners of the frame 3 and formed in a plate shape, and extend toward the inside along the Y direction from a side of the frame 3 along the X direction. Further, the pair of the beam portions 5A and 5B are connected to the shaft portions 4A and 4B via tips of the beam portions 5A and 5B which is corners inside in the X direction, as connecting portions 51, and arranged so as to interpose the reflective plate 2 in between in the X direction. At this time, slits 52 extending from the tip to the base end of the beam portions 5A and 5B are formed between the beam portions 5A and 5B and the frame 3. That is, a gap is formed between a portion of the frame 3 extending along the Y direction and a side on the outside in the X direction (a side located the farthest from the reflective plate 2) of the beam portions 5A and 58, and the drive units 10A and 10B have a shape in which the beam portions 5A and 5B are projecting from sides along the X direction of the frame 3.

The drive elements 6A and 68 are, for example, piezoelectric elements in which a lower electrode, a piezoelectric substance, and an upper electrode are laminated in this order on a silicon substrate, and is expanded and compressed by being applied with voltage between the electrodes. The drive elements 6A and 6B are arranged on the beam portions 5A and 5B, and the beam portions 5A and 5B are warped and deformed with a base end side (frame 3 side) as a fixed end and with a tip side as a free end when the drive elements 6A and 68 are expanded and/or compressed. In the present example, the tips of the beam portions 5A and 5B is displaced toward one side (in a front side of the drawing plane in FIG. 1) in the Z direction when the voltage is applied.

The drive elements 6A and 6B are formed in a trapezoid shape as viewed in a planar view, and include first sides 61 on the base sides of the beam portions 5A and 5B, second sides 62 on the tip sides thereof, third sides 63 on the inside in the X direction inside the frame 3, and fourth sides 64 on the outside in the X direction. The first sides 61 incline with respect to the X direction so as to become closer to a rotation axis O1 as getting more separated from the reflective plate 2 along the X direction, and the entirety thereof is an inclination portion. The second sides 62 are arranged on extension lines of the shaft portions 4A and 4B and extend along the X direction. Both of the third sides 63 and the fourth sides 64 extend along the Y direction.

Below, a movement of each portion when rotating the reflective plate 2 by the drive units 10A and 10B is described. Voltage is applied substantially at the same time to the drive elements 6A and 6B in the drive unit 10A, and voltage is applied substantially at the same time to the drive elements 6A and 6B in the drive unit 10B. Voltage is applied at timings which are different from each other to the drive elements 6A and 6B in the drive unit 10A and the drive elements 6A and 6B in the drive unit 10B.

When the voltage is applied to the drive elements 6A and 6B in the drive unit 10A, the beam portions 5A and 5B of the drive unit 10A are warped and deformed and the shaft portions 4A and 4B connected to the connecting portion 51 as the tip thereof try to move to one side in the Z direction. At this time, the beam portions 5A and 5B are not deformed in the drive unit 101 and shaft portions 4A and 4B do not move. Thus, the reflective plate 2 rotates around the rotation axis O2 (a rotation axis extending through the shaft portions 4A and 4B of the drive unit 10B) as the center so that a side of the reflective plate 2 facing the drive unit 10A advances toward the one side in the Z direction and a side of the reflective plate 2 facing the drive unit 10B advances toward another side in the Z direction.

On the other hand, when the voltage is applied to the drive elements 6A and 6B in the drive unit 10B, the reflective plate 2 rotates around the rotation axis O1 (a rotation axis extending through the shaft portions 4A and 4B of the drive unit 10A) as the center so that the side of the reflective plate 2 facing the drive unit 10B advances toward the one side in the Z direction and the side of the reflective plate 2 facing the drive unit 10A advances toward another side in the Z direction.

Figure 2:
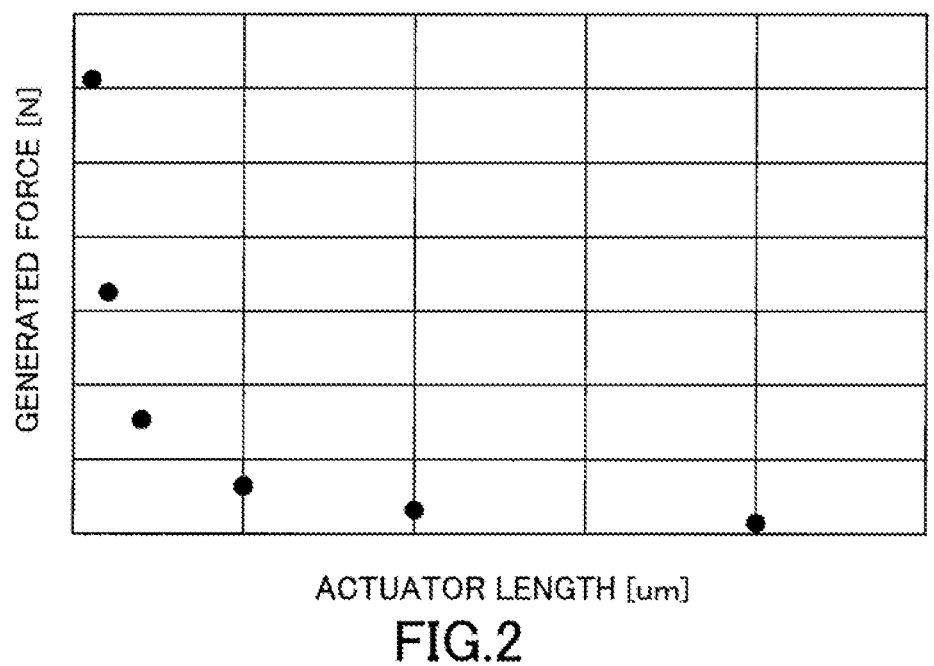
FIG. 2 is a graph showing the relation between the length of an actuator and a generated force in the optical deflector.

Here, a relation between a size in the Y direction of the drive element (a length of an actuator) when the beam portion is warped and deformed and a force with which the entire beam portion tries to cause the reflective plate to rotate (a generated force) is shown in FIG. 2. A graph of FIG. 2 indicates a relation between the length of the actuator and the generated force under a condition that the size in the Y direction of the drive element is substantially constant throughout an area in the X direction, and the longer the actuator is, the more the entire generated force is decreased.

Figure 3:
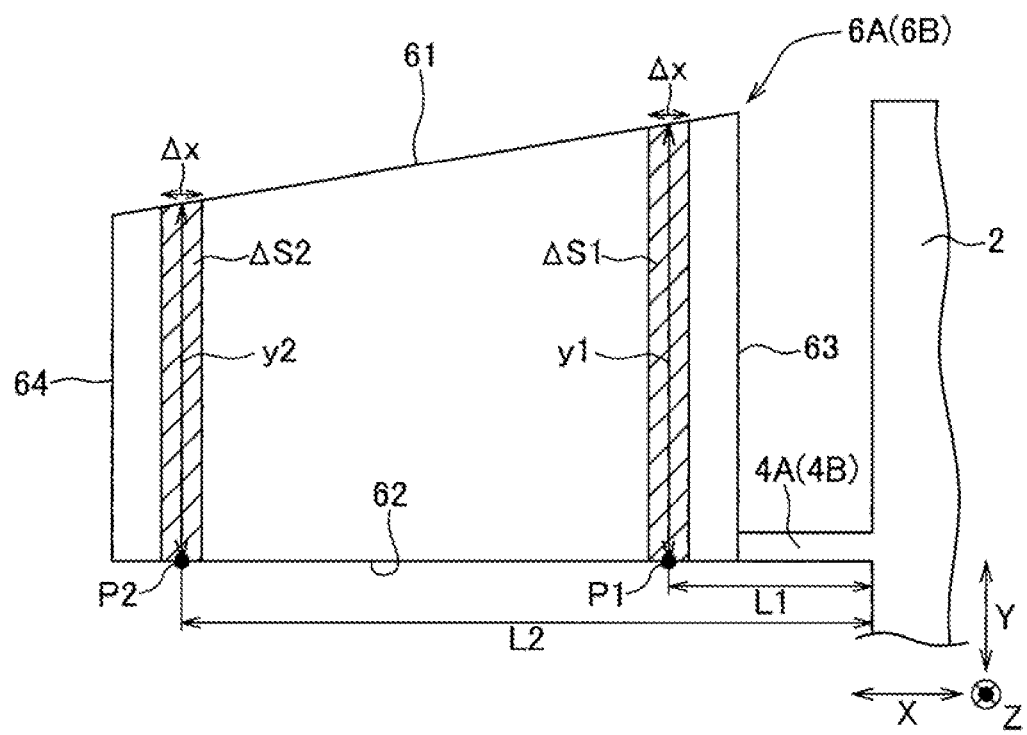
FIG. 3 is a plan view illustrating an enlarged main part of the optical deflector.

Since the first sides 61 of the drive elements 6A and 6B are inclined as mentioned above and the second sides 62 extend along the X direction, the size in the Y direction of the drive elements 6A and 6B becomes smaller when the drive elements 6A and 6B are more separated from the reflective plate 2. Therefore, as shown in FIG. 3, in the drive elements 6A and 6, a size in the Y direction y at first positions P1 which are separated by a first distance L1 from the reflective plate 2 along the X direction is larger than a size in the Y direction y2 at second positions P2 separated by a second distance L2(L2>L1) from the reflective plate 2 along the X direction.

Further, minute areas ΔS1 of the drive elements 6A and 6B in a range of a width Δx around the first positions P1 as the centers are larger than minute areas ΔS2 of the drive elements 6A and 6B in a range of the width Δx around the second positions P2 as the center.

Since the drive elements 6A and 6B have the above-mentioned shape, when being warped and deformed, the displacement of the tips of the beam portions 5A and 5B becomes larger more inwardly in the X direction. A swing angle of the reflective plate 2 is affected by the amount of the displacement at a position of the tips of the beam portions 5A and 5B which is closer to the reflective plate 2 (inwardly in the X-direction).

Further, the generated force becomes larger at a position of the tips of the beam portions 5A and 5B which is further away from the reflective plate 2 (outwardly in the X-direction). Therefore, compared to a configuration in which the size in the Y direction of an entire area of the beam portion is made to be the same as the length of the third side 63, a generated force of the entire beam portions 5A and 5B is increased. The generated force of the entire beam portions 5A and 5B affects the swing angle of the reflective plate 2.

According to the above-mentioned configuration, in the drive elements 6A and 6B, since the size in the Y direction at the first positions P separated by the first distance L1 from the reflective plate 2 is larger than the size in the Y direction at the second positions P2 separated by the second distance L2 from the reflective plate 2, wherein the second distance L2 is greater than the first distance L1, it is possible to increase the displacement of the tips of the beam portions 5A and 5B at the first positions P1 and to make the swing angle of the reflective plate 2 large by increasing the generated force of the entire beam portions 5A and 5B.

Since the minute areas ΔS1 of the drive elements 6A and 6B in the range of the width Δx around the first positions P1 as the centers are larger than the minute areas ΔS2 of the drive elements 6A and 68 in the range of the width Δx around the second positions P2 as the centers, it is possible to increase the displacement of the tips of the beam portions 5A and 5B at the first positions P1 and to make the swing angle of the reflective plate 2 large by increasing the generating force of the entire beam portions 5A and 5B by obtaining a large generating force at the second positions P2.

Since the first sides 61 extend inclining with respect to the X direction so as to become closer to the rotation axis O1 as getting more separated from the reflective plate 2 along the X direction, the size in the Y direction of the drive elements 6A and 68 at the first positions P1 becomes larger than the size in the Y direction of the drive elements 6A and 6B at the second positions P2, it is possible to increase the displacement of the tips of the beam portions 5A and 5B at the first positions P1 and to increase the generated force of the entire beam portions 5A and 5B, and it is possible to make the swing angle of the reflective plate 2 large.

The second sides 62 of the drive elements 6A and 6B are arranged on the extension lines of the shaft portions 4A and 41, thereby enabling the increased displacement of the tips of the beam portions 5A and 5B.

The slits 52 are formed between the beam portions 5A and 5B and the frame 3, thereby enabling displacement of the tips of the beam portions 5A and 5B even at positions which are distant from the reflective plate 2.

The optical deflector 1A includes the two sets of drive units 10A and 101 and the drive units 10A and 10B rotate the reflective plate 2 in directions opposite to each other, thereby enabling the large total swing angle of the reflective plates 2.

Note that the present invention is not limited to the aforementioned Example, but includes other configurations which can achieve the object of the invention, and the following modifications are also included in the invention.

Figure 4:
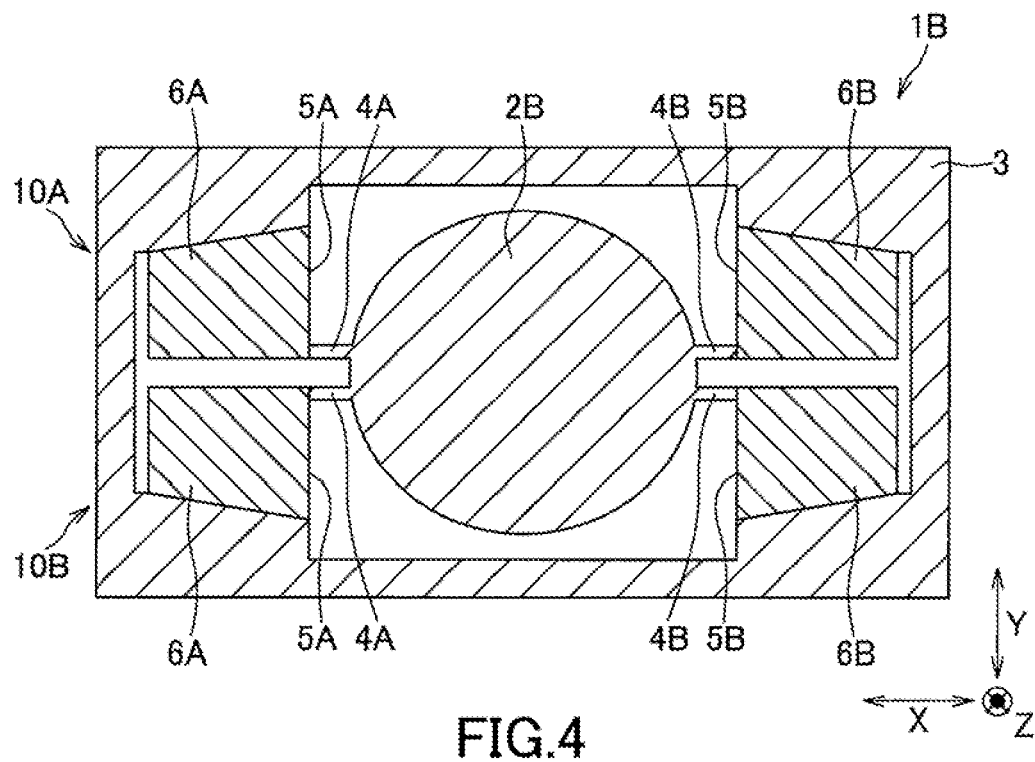
FIG. 4 is a plan view illustrating an optical deflector according to a first exemplar variation of the present invention.

For example, in the above-mentioned example, the reflective plate 2 is formed in a rectangular plate shape, but, it is sufficient if a reflective plate has an appropriate shape. As an optical deflector 1B shown in FIG. 4 does, a disk-shaped reflective plate 28 may also be used. Further, an oval-shaped reflective plate may also be used.

Figure 5:
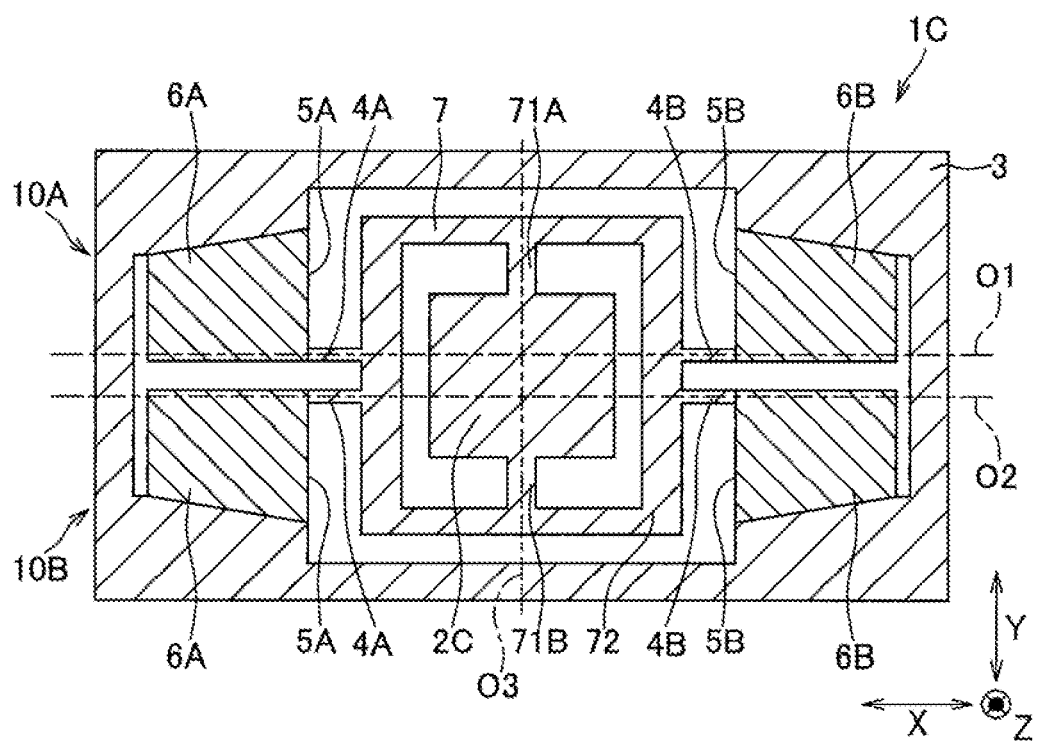
FIG. 5 is a plan view illustrating an optical deflector according to a second exemplar variation of the present invention.

Further, in the above-mentioned example, the reflective plate 2 is rotated around the rotation axes O1 and O2 as the centers, but, the reflective plate may be configured so as to be rotated around a plurality of rotation axes extending in directions which are different from each other as the center. For example, as an optical deflector 1C shown in FIG. 5, it may be configured so that a reflective plate 2C is capable of rotating around the rotation axes O1 and O2 along the X-direction as the center and the reflective plate 2C is capable of rotating around a rotation axis O3 along the Y direction as the center.

The optical deflector 1C is the optical deflector 1A having the reflective plate 2 thereon replaced with a rotary unit 7. The rotary unit 7 includes the reflective plate 2C, a pair of shaft portions 71A and 71B, a frame 72, and a driving means. The pair of shaft portions 71A and 71B extend along the Y direction and determine the rotation axis O3. The driving means is controlled independently of the drive elements 6A and 6B and rotates the reflective plate 2C around the rotation axis O3 as the center. According to such a configuration, it is possible to scan two-dimensionally with light.

Further, in the above-mentioned example, the first sides 61 of the drive elements 6A and 61 extend inclining with respect to the X direction so as to become closer to the rotation axis O1 as getting more separated from the reflective plate 2 along the X direction and the entirety thereof is the inclination portion, however, a first side of the drive element may have the inclination portion in a portion thereof.

Further, in the above-mentioned example, the second sides 62 of the drive elements 6A and 6B are arranged on extension lines of the shaft portions 4A and 4B, however, it is not limited to the configuration like this. That is, the drive element does not need to be arranged in tip portions of the beam portions 5A and 5B and the drive element may be provided being protruded from the shaft portions 4A and 4B in the Y direction.

Further, in the above-mentioned example, the optical deflector 1A includes the two sets of the drive units 10A and 10B, however, an optical deflector may include only one set of drive units and the number of drive units may be appropriately set according to a design value of a swing angle.

Further, in the above-mentioned example, since the first sides 61 of the drive elements 6A and 6B are inclined, the size in the Y direction at the first positions P1 of the drive elements 6A and 6B is larger than the size in the Y direction at the second positions P2, however, it is not limited to the configuration like this. For example, a first side may be formed in a step-like shape by including a portion extending along the X direction, and a portion extending toward the inside in the Y direction, and a portion extending along the X direction in order from the inside in the X direction. Further, the first side may be a side in which a portion extending along the X direction, an inclined portion, and a step-like shaped portion are appropriately combined.

Further, throughout the entire area in the X direction of the drive element, a shape of the drive element does not need to be a shape in which the size in the Y direction becomes larger mom inwardly in the X direction. That is, the size in the Y direction at a position on the outside in the X direction may not partially be larger than a size at a position on the inside, and the drive element may include at least one set of a first position and a second position which satisfies such a relation in the above-mentioned example.

Although the best configuration and method and the like for carrying out the present invention have been described above, the invention is not limited to them. That is, the invention is particularly illustrated and described mainly with reference to the specific example, but a person skilled in the art can variously modify the above-described example in terms of shapes, materials, the amount and other detailed configurations without departing the scopes of the technical idea and purposes of the present invention. Therefore, the descriptions limited to the above-disclosed shapes and materials etc. are illustratively described to make it easy to understand the present invention, and they do not limit the invention. Thus, descriptions with names of members from which a portion or all of the limitations such as the shapes and the materials are removed are included in the invention.

REFERENCE SIGNS LIST 1 optical deflector
2 reflective plate
3 frame
4A, 4B shaft portion
5A, 5B beam portion
52 slit
6A, 6B drive element
61 first side
62 second side
10A, 10B drive unit

The invention claimed is:

1. An optical deflector comprising:
a reflective plate;
a pair of shaft portions extending in a direction of a rotation axis of the reflective plate and determining the rotation axis of the reflective plate;
a pair of beam portions supporting the pair of shaft portions while extending to intersect the rotation axis; and
drive elements rotating the reflective plate by deforming the beam portions,
wherein the drive elements are arranged in the beam portions and a size thereof in a direction orthogonal to the rotation axis at positions separated by a first distance from the reflective plate along an axial direction of the rotation axis is larger than a size in the direction orthogonal to the rotation axis at positions separated by a second distance from the reflective plate along the axial direction, the second distance being greater than the first distance.

2. The optical deflector according to claim 1, wherein in the drive elements, minute areas having a predetermined width at the positions separated by the first distance from the reflective plate is larger than minute areas having the predetermined width at the positions separated by a second distance from the reflective plate.

3. The optical deflector according to claim 1, wherein first sides on a side of base ends of the beam portions in the drive elements have inclination portions which are inclined with respect to the axial direction to become closer to the rotation axis as getting more separated from the reflective plate along the axial direction.

4. The optical deflector according to claim 1, wherein second sides on a side of tips of the beam portions in the drive elements are arranged on extension lines of the shaft portions.

5. The optical deflector according to claim 1, further comprising a frame surrounding the reflective plate and the beam portions,
wherein slits extending from a tip of the beam portions to a base end are formed between the beam portions and the frame.

6. The optical deflector according to claim 1, wherein a drive unit is constituted with the pair of shaft portions, the pair of the beam portions, and the drive elements, and
wherein the optical deflector comprises two sets of drive units arranged to be aligned in a direction orthogonal to the rotation axis.

7. The optical deflector according to claim 1, wherein second sides on a side of tips of the beam portions in the drive elements have a step shape including at least a first portion extending along the axial direction, a second portion extending in the direction orthogonal to the rotation axis, and a third portion extending along the axial direction.

8. The optical deflector according to claim 1, wherein first sides on a side of base ends of the beam portions in the drive elements have a step shape including at least a first portion extending along the axial direction, a second portion extending in the direction orthogonal to the rotation axis, and a third portion extending along the axial direction.

* * * * *